United States Patent [19]

Hirose et al.

[11] 4,339,326

[45] Jul. 13, 1982

[54] SURFACE PROCESSING APPARATUS UTILIZING MICROWAVE PLASMA

[75] Inventors: Masahiko Hirose; Tsuyoshi Yasui; Masahiko Yotuyanagi, all of Yokohama, Japan

[73] Assignee: Tokyo Shibaura Denki Kabushiki Kaisha, Kawasaki, Japan

[21] Appl. No.: 208,404

[22] Filed: Nov. 19, 1980

[30] Foreign Application Priority Data

Nov. 22, 1979 [JP] Japan ................................ 54-150638

[51] Int. Cl.³ .......................... C23C 15/00; C23F 1/00
[52] U.S. Cl. ................................. 204/298; 204/192 E; 204/164; 156/345; 118/620; 422/186
[58] Field of Search .................... 204/192 E, 298, 164; 156/345, 643; 250/531; 427/38-39; 118/620

[56] References Cited

U.S. PATENT DOCUMENTS 4,265,730 5/1981 Hirose et al. ........................ 204/298

Primary Examiner—Aaron Weisstuch
Attorney, Agent, or Firm—Schwartz, Jeffery, Schwaab, Mack, Blumenthal & Koch

[57] ABSTRACT

There is provided an apparatus for processing a surface of an object to be processed by utilizing microwave plasma within a plasma-producing chamber, which comprises a microwave power-generating means; a wave guide for transmitting microwaves generated from said microwave power-generating means; a closed vessel constituting the plasma-producing chamber separated from said wave guide by a separating means; an antenna for transmitting microwaves, one end thereof protruding into the wave guide and another end thereof protruding into the closed vessel and a supporting means, for holding or supporting the electroconductive object to be processed, provided within the closed vessel and so attached to the antenna that the antenna and the electroconductive object may be electrically connected to each other.

9 Claims, 2 Drawing Figures

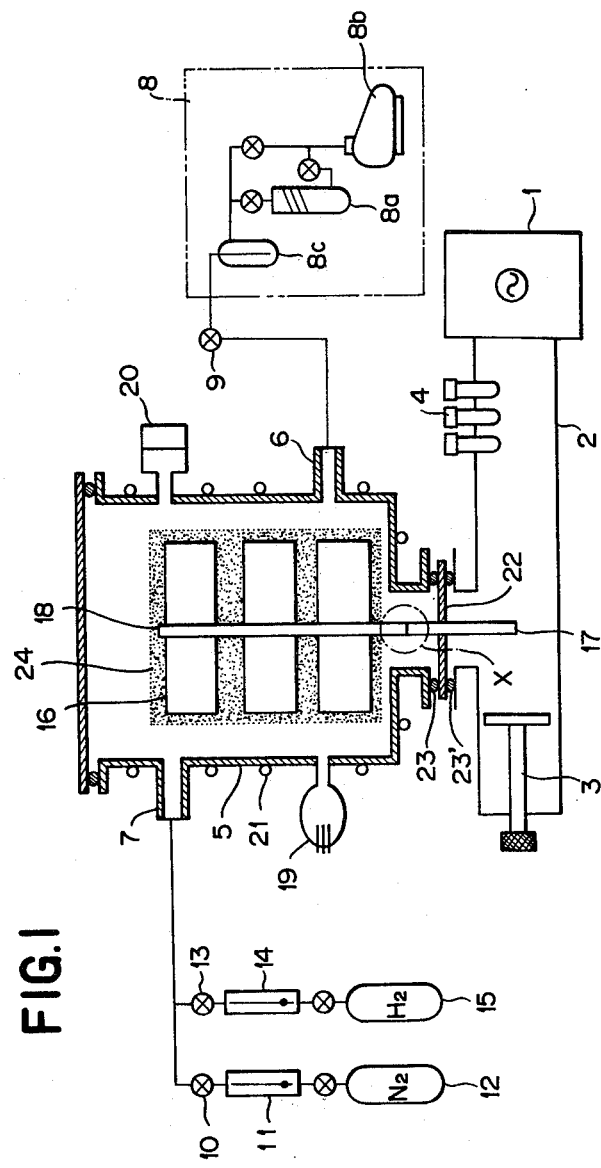
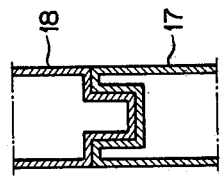
FIG.1
FIG.2

SURFACE PROCESSING APPARATUS UTILIZING MICROWAVE PLASMA

BACKGROUND OF THE INVENTION

This invention relates to a surface processing apparatus utilizing microwave plasma produced by microwave discharge for processing a surface of an object made of electroconductive material such as metal.

Several methods are known utilizing plasma for processing a surface. One method creates plasma by introducing a high frequency (less than several 10 MHz) microwave signal or field into an enclosed vessel containing a gas and an object to be processed, wherein the microwave signal is produced by a coil wrapped around the vessel; the gas, after being introduced to said microwave signals, is discharged, thereby changing the gas into plasma, which can then react with the surface of the object. In this manner, the surface can be processed. This system utilized in such conventional apparatus, however, has several drawbacks as described hereinbelow.

In the system employing the high frequency discharge, a satisfactory matching between the plasma and the generator cannot be easily attained, and energy loss at the discharge region caused by reflection of the high frequency electrical signal toward the outside of the discharge chamber is at a high level. Accordingly, the generated electric field cannot be applied efficiently to produce the plasma. Compensation for such a low efficiency requires installation of a large-sized generator and a large power source. Consequently, the rate of production of activated gas and ions in the plasma is low, and thus the processing and reaction efficiency are at a low level throughout the entire process.

There is known another apparatus called a chemical dry etching (CDE) apparatus in which the processing is carried out in a region separated from the plasma-producing region. Even in this apparatus, a microwave discharge has been recently employed for the production of plasma. This system conventionally involves the production of plasma in a region penetrating the microwave wave guide. Accordingly, if the processing is intended to be carried out in the plasma-producing region, neither a great number of samples (objects) nor a large-scaled sample can be processed because the dimensions of the discharge region are restricted by the dimensions of the wave guide. Another drawback involved is that the pressure of the plasma gas cannot be easily controlled within a wide range.

SUMMARY OF THE INVENTION

In view of the drawbacks mentioned, a primary object of the present invention is accordingly to provide a surface processing apparatus utilizing a plasma produced by microwave discharge, wherein said processing takes place within a plasma-producing chamber; said surfacing process apparatus can be used for a variety of sample objects and has advantageous aspects such as: the processing and reaction efficiencies are prominently higher; the plasma can be produced throughout a larger area; and the pressure of plasma gas produced can be controlled within a wider range.

According to the present invention, there is provided an apparatus for processing a surface of an object by utilizing plasma produced by microwave discharge within a plasma-producing chamber, which comprises:

a microwave power-generating means;
a wave guide for transmitting a microwave generated from said microwave power-generating means;
a closed vessel comprising a plasma-producing chamber, provided with an evacuating means and a gas-introducing means, and separated from said wave guide by a separating means;
an antenna for receiving and then transmitting the microwaves, extending through said separating means so that one end thereof may protrude within the wave guide and another end thereof may protrude within the closed vessel; and
a supporting means provided within said closed vessel and attached to said antenna, capable of supporting or holding an electroconductive object to be processed in such a manner that the antenna and the electroconductive object are electrically connected to each other.

In the apparatus of the invention, the microwaves transmitted through the wave guide are introduced into the closed vessel by means of a metallic antenna. The object or sample to be processed is placed on a supporting means so as to electrically connect the object with the antenna. Thus, the object to be processed acts as an antenna per se and thus a plasma of high density can be produced around the object. Accordingly, the surface processing is performed very efficiently.

In this apparatus, the closed vessel, surrounding the plasma-producing region, communicates with the wave guide only through the antenna. For this reason, the surface processing can be performed within a large-sized vessel regardless of the diameter of the wave guide.

BRIEF DESCRIPTION OF THE DRAWINGS

The present invention will be further described by referring to a preferred embodiment illustrated in the accompanying drawings, in which:

FIG. 1 schematically illustrates an apparatus used for nitriding a metal surface, which utilizes a plasma of a gaseous mixture of nitrogen and hydrogen, and which embodies this invention; and FIG. 2 is an enlarged sectional view showing the portion X indicated by the chain circle.

DETAILED DESCRIPTION OF PREFERRED EMBODIMENTS

In FIG. 1, 1 denotes a microwave power-generating means, which generates microwaves, for instance, of a frequency equal to 2,450 MHz. The generated microwaves are then transmitted through a wave guide 2 (109×55 mm, in accordance with Japanese Industrial Standard (JIS) WRJ-2). The wave guide 2 is equipped with a means for matching the transmission of microwaves, comprising a plunger 3 and a three-stub tuner 4. A plasma-producing chamber is in the form of a stainless steel closed vessel 5 (inner diameter 30 cm and length 50 cm). The closed vessel is made of a non-microwave-transmitting material so that there is no leakage of the microwave signal. For this reason, possible influencing factors, such as variation of impedance, originating outside the vessel, will not affect the surface processing. The closed vessel 5 can also be made of a non-metallic material with a coated electroconductive film, or a non-metallic material equipped on the outer wall with a water jacket. The closed vessel 5 is provided with a gas outlet 6 and a gas inlet 7. The outlet 6 is connected to an evacuating device 8 via a valve 9.

The evacuating device 8 comprises a diffusion pump 8a, a rotary pump 8b and a cold trap 8c. The gas inlet 7 is connected to a nitrogen gas cylinder 12 via a valve 10 and a flow meter 11. The gas inlet 7 is also connected to a hydrogen gas cylinder 15 via a valve 13 and a flow meter 14.

The closed vessel 5 has a diameter equal to at least one-half of the wavelength of the microwaves to be introduced. Within the vessel 5, the object or a number of objects to be processed 16 are supported by a metallic supporting pole 18, preferably a pipe made of stainless steel. Means for supporting an object to be processed is provided, which is connected to the top end of the antenna 17, protruding within the vessel 5, as illustrated in FIG. 2. The closed vessel 5 is further equipped with an ionization vacuum gauge 19 for allowing observation of the vacuum level of the inner space of the vessel 5 during an evacuating stage. The vessel is further equipped with a diaphragm type pressure gauge 20 which permits observation of the pressure of the inner space of the vessel 5 during a processing stage. The closed vessel 5 is then provided on the outer wall with a cooling pipe 21, so that the vessel 5 can be cooled from the outside by running cooling-water through the pipe 21.

The microwaves transmitted through the wave guide 2 are received by antenna 17 made of copper or stainless steel, protruding within a wave guide 2, and then transmitted into the closed vessel 5. The antenna 17 should preferably be a pipe-like antenna. A hole is provided in a quartz disc 22 generally located at a central portion of the disc 22, said hole providing an airtight seal around the antenna, when it is introduced therethrough. One end of the antenna 17 is exposed to the inside of the closed vessel 5 and another end is exposed to the inside of the wave guide 2. O-rings 23 and 23' are placed in between the vessel 5 and the disc 22, and between disc 22 and the wave guide, respectively, in order to provide airtight seals therebetween. There is no specific limitation on the shape of a supporting means 18, as long as the supporting means is able to support the object (sample) 16 to be processed in such a manner as to maintain the electrical connection between the object 16 and the antenna 17. Therefore, the shape of the supporting pole 18 shown in FIG. 1 does not limit the present invention in any manner. In another embodiment, the supporting means 18 can be an antenna per se by further extending the antenna 17 within the vessel 5.

In carrying out a processing procedure, the closed vessel 5 is evacuated, and then a mixture comprising an appropriate ratio of nitrogen gas and hydrogen gas is introduced into the vessel 5. After the introduction of the gaseous mixture, the antenna 17 receives a microwave signal produced by the microwave-power-generating means, and then transmits the signal into the vessel to produce a plasma 24. Thus, nitriding of the surface of the sample 16 is accomplished. In the apparatus of the invention, the sample 16 serves as an antenna per se, so that a plasma of a high density is produced around the sample 16.

The apparatus described above and an operation of the apparatus are further described hereinafter with respect to a plasma nitriding of a steel alloy such as SACM-1.

In operation, sample 16, steel alloy plates of 120 mm×50 mm×5 mm are, as shown in FIG. 1, fixed to the supporting means 18 made of stainless steel. The supporting means 18 is then attached to the upper end of the antenna 17. Subsequently, the closed vessel 5 is evacuated to reach a level of $1 \times 10^{-6}$ Torr by operating the diffusion pump 8a contained in the evacuating device 8. Then, the valve for the diffusion pump 8a is shut, and the nitrogen gas and the hydrogen gas are introduced into the closed vessel 5 by opening the valves 10 and 13. The valves 10 and 13 are adjusted so as to keep the pressure in the vessel 5 around 1.5 Torr. The ratio between the nitrogen and hydrogen gases can be varied depending upon the type of nitriding to be done. In this instance, the ratio is set at 1:1. The valve 9 is adjusted to keep the flow rate of the gaseous mixture into the evacuating device at about 20 cc/min.

The operation of the rotary pump 8b draws the gaseous mixture through the cold trap 8c where it is cooled by liquid nitrogen. While in the vessel, the gaseous mixture is discharged by a 2 KW, 2,450 MHz microwave signal generated by the microwave-power-generating source 1, to produce a plasma 24. In the plasma produced by the microwave discharge, active species such as nitrogen ions, nitrogen-hydrogen ions, and a variety of radicals are present. The so produced active species react with the sample 16. The plasma-reaction continues for approximately 2 hours, and then the discharge is terminated. Then, while the vessel 5 is kept filled with nitrogen gas, the sample 16 is taken out of the vessels. The surface of the processed sample has turned gray. A metallographic study is performed on the object to give sectional photographs, which show that a very hard nitride layer, approximately 100–200 $\mu$m thick, is formed on the sample plate.

The plasma-processing apparatus of the above-described embodiment comprises the closed vessel 5 which forms a spacious plasma-producing chamber separated from the wave guide 2. Accordingly, there are several advantages; first, a great number of samples can be readily processed in one operation, or a large-sized sample can be processed; and second, the discharge can be stably maintained even if the discharged plasma gas pressure is varied within a wide range, and therefore, the present apparatus is applicable to a variety of surface-processing or plasma-reactions. Since the discharge space is large and the discharge is kept stable even at a low pressure, (for instance, $10^{-2}$–$10^{-3}$ Torr) due to the high frequency characteristics of the microwaves, the mean free paths of the ions and radicals are lengthened to produce a homogenous plasma spreading extensively throughout the vessel. For this reason, the surface-processing can be realized with a more homogenous distribution. Moreover, since the sample to be processed serves as an antenna per se, the active species necessary for nitriding, (e.g., ions and radicals present in the high density plasma produced around the antenna) can be very efficiently applied. Accordingly, the energy efficiency is vastly improved.

The use of the microwave discharge facilitates the matching between plasma and generator. Moreover, since the microwave is transmitted by the use of a wave guide and a metallic antenna, the electromagnetic reflectance loss is extremely decreased, thereby allowing a high electric power efficiency. Further, since a large power microwave signal can be easily introduced into a plasma, the rate of the processing is increased and accordingly a shorter processing time is required.

In the hereinbefore-mentioned description of an embodiment, a mixture of nitrogen and hydrogen gases is mentioned. However, other gases such as ammonia are naturally applicable. Further, the processing is not limited to nitriding, and other processings such as carbonization and boridation are likewise applicable.

As described hereinbefore, the surface-processing apparatus of the present invention is an apparatus for processing a surface of an object within a plasma-producing chamber. The plasma is produced by introducing a microwave signal into an enclosed, gas-filled vessel, received from a wave guide by means of a metallic antenna, wherein the electroconductive object to be processed acts as an antenna per se since it is electrically connected to the antenna within the vessel. Therefore, it is advantageous not only in that the reaction efficiency is prominently increased, but also in that a plasma can be produced throughout an extensive area. Moreover, there are other advantages such as that the plasma gas pressure is controllable within a wide range. Consequently, the apparatus of the present invention is useful for nitriding, carbonization, etching or other surface-processing utilizing plasma reactions of a variety of samples.

We claim:

1. An apparatus for processing a surface of an object to be processed by utilizing microwave plasma within a plasma producing chamber, which comprises;
   a microwave power-generating means;
   a wave guide for transmitting microwaves generated by said microwave power-generating means;
   a closed vessel constituting the plasma producing chamber provided with an evacuating means and a gas introducing means, and separated from said wave guide by a separating means;
   an antenna for receiving and transmitting said microwaves, passing through said separating means so that one end thereof extends into the wave guide and the other end thereof extends into the closed vessel; and
   a supporting means provided within said closed vessel and attached to said antenna, capable of supporting an electroconductive object to be processed in such a manner that the antenna and the electroconductive object are electrically connected to each other.

2. An apparatus according to claim 1, wherein said closed vessel is made of a non-microwave-transmitting metal, a non-metallic material coated with an electroconductive film, or a non-metalic material equipped on the outer wall with a water jacket.

3. An apparatus according to claim 1, wherein said closed vessel is made of stainless steel.

4. An apparatus according to claim 1, wherein said closed vessel has the diameter of at least a half of the wavelength of microwave to be introduced.

5. An apparatus according to claim 1, wherein said separating means is a quartz disc provided between the closed vessel and the wave guide and held air-tightly by O-rings.

6. An apparaus according to claim 1, wherein said antenna is passed and held air-tightly through the separating means substantially at a central portion thereof.

7. An apparatus according to claim 1, wherein said antenna is made of stainless steel, in the form of a pipe.

8. An apparatus according to claim 1, wherein said supporting means is a pole or pipe made of stainless steel, one end of which is connected to the top end of the antenna extending into the closed vessel.

9. An apparatus according to claim 8, wherein said supporting means is an extended portion of the antenna.

* * * * *